United States Patent
Hugosson et al.

(10) Patent No.: US 10,771,792 B2
(45) Date of Patent: Sep. 8, 2020

(54) ENCODING DATA ARRAYS

(71) Applicant: Arm Limited, Cambridge (GB)

(72) Inventors: Sven Ola Johannes Hugosson, Lund (SE); Tomas Fredrik Edso, Lund (SE); Dominic Hugo Symes, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/266,664

(22) Filed: Feb. 4, 2019

(65) Prior Publication Data

US 2019/0246117 A1 Aug. 8, 2019

(30) Foreign Application Priority Data

Feb. 6, 2018 (GB) .................................. 1801891.1

(51) Int. Cl.
*H04N 19/00* (2014.01)
*H04N 19/174* (2014.01)
(Continued)

(52) U.S. Cl.
CPC ........ *H04N 19/174* (2014.11); *H03M 7/3064* (2013.01); *H03M 7/6023* (2013.01);
(Continued)

(58) Field of Classification Search
CPC .. H04N 19/174; H04N 19/119; H04N 19/152; H04N 19/46; H03M 7/3064; H03M 7/6023
See application file for complete search history.

(56) References Cited

U.S. PATENT DOCUMENTS

| | | | |
|---|---|---|---|
| 2004/0179619 A1* | 9/2004 | Tian | H04N 21/23406 |
| | | | 375/240.26 |
| 2005/0190774 A1* | 9/2005 | Wiegand | H04L 29/06027 |
| | | | 370/395.64 |

(Continued)

FOREIGN PATENT DOCUMENTS

| | | |
|---|---|---|
| GB | 2513303 | 10/2014 |
| JP | 2003009147 | 1/2003 |

OTHER PUBLICATIONS

GB Combined Search and Examination Report dated Jul. 30, 2018, GB Patent Application No. GB1801891.1.
(Continued)

*Primary Examiner* — Zhihan Zhou
(74) *Attorney, Agent, or Firm* — Vierra Magen Marcus LLP

(57) ABSTRACT

When encoding an array of data elements, or a stream of such arrays, using an encoder comprising encoding circuitry operable to encode the array(s) of data elements as a plurality of independent segments, wherein each independent segment can be decoded independently; a header is generated for output with an encoded data stream including the plurality of independent segments wherein the header contains information indicative of the location of each of the plurality of independent segments within the encoded data stream. When an encoded data stream associated with such a header is to be decoded, a decoder may thus read the header to identify the location of the independent segment within the data stream and then read and decode the identified segments from the identified location(s) in the data stream.

20 Claims, 9 Drawing Sheets

(51) Int. Cl.
*H03M 7/30* (2006.01)
*H04N 19/152* (2014.01)
*H04N 19/46* (2014.01)
*H04N 19/119* (2014.01)

(52) U.S. Cl.
CPC ......... *H04N 19/119* (2014.11); *H04N 19/152* (2014.11); *H04N 19/46* (2014.11)

(56) References Cited

U.S. PATENT DOCUMENTS

| | | | |
|---|---|---|---|
| 2014/0307775 A1* | 10/2014 | Ouedraogo | H04N 19/159 375/240.02 |
| 2015/0063439 A1* | 3/2015 | Mochizuki | H04N 19/176 375/240.02 |
| 2016/0261665 A1* | 9/2016 | Stockhammer | H04L 65/604 |
| 2016/0381386 A1* | 12/2016 | Krishnan | H04N 19/436 375/240.14 |
| 2017/0163994 A1* | 6/2017 | Sanchez De La Fuente | H04N 21/4312 |

OTHER PUBLICATIONS

K. Misra et al., "An Overview of Tiles in HEVC," IEEE Journal of Selected Topics in Signal Processing, vol. 7, issue 6, 2013, pp. 969-977.

* cited by examiner

ENCODING DATA ARRAYS

BACKGROUND

The technology described herein relates to methods and systems for encoding data arrays (and for decoding data streams encoding such data arrays).

It is common to encode arrays of data elements, such as arrays of image data values, so as to compress the data in order to reduce bandwidth and memory consumption. This is particularly desirable in data processing apparatus, e.g. of portable devices such as digital cameras, or mobile devices including such cameras, where processing resources and power may be limited.

In order to encode an array of data elements, the array of data elements is often divided into smaller "source" blocks of data elements and encoded on a block by block basis based on the difference between the source block and a "reference" block of data elements.

For instance, when encoding a still image, or a single video frame, the source image data is generally divided into a number of blocks that are used for the compression algorithm. The encoding is then performed by processing the blocks in the image. For instance, typically, a set of difference values compared to a reference block is determined for a block, a transform is applied (such as a discrete cosine transform) to convert the difference information for the block into a frequency-domain representation, and the transformed co-efficients (i.e. frequencies) are then quantised to achieve some of the data compression required. The quantised co-efficients can then be stored as difference values compared to a reference block. An encoded data stream including the compressed, encoded image data may thus be output, e.g. for storage in memory, or for transmission to an external device for storage or display.

The Applicants believe that there remains scope for, and a need for, more efficient arrangements for encoding data arrays and for decoding data streams encoding such data arrays.

BRIEF DESCRIPTION OF THE DRAWINGS

Various embodiments of the technology described herein will now be described by way of example only and with reference to the accompanying drawings, in which.

DETAILED DESCRIPTION

Figure 1:
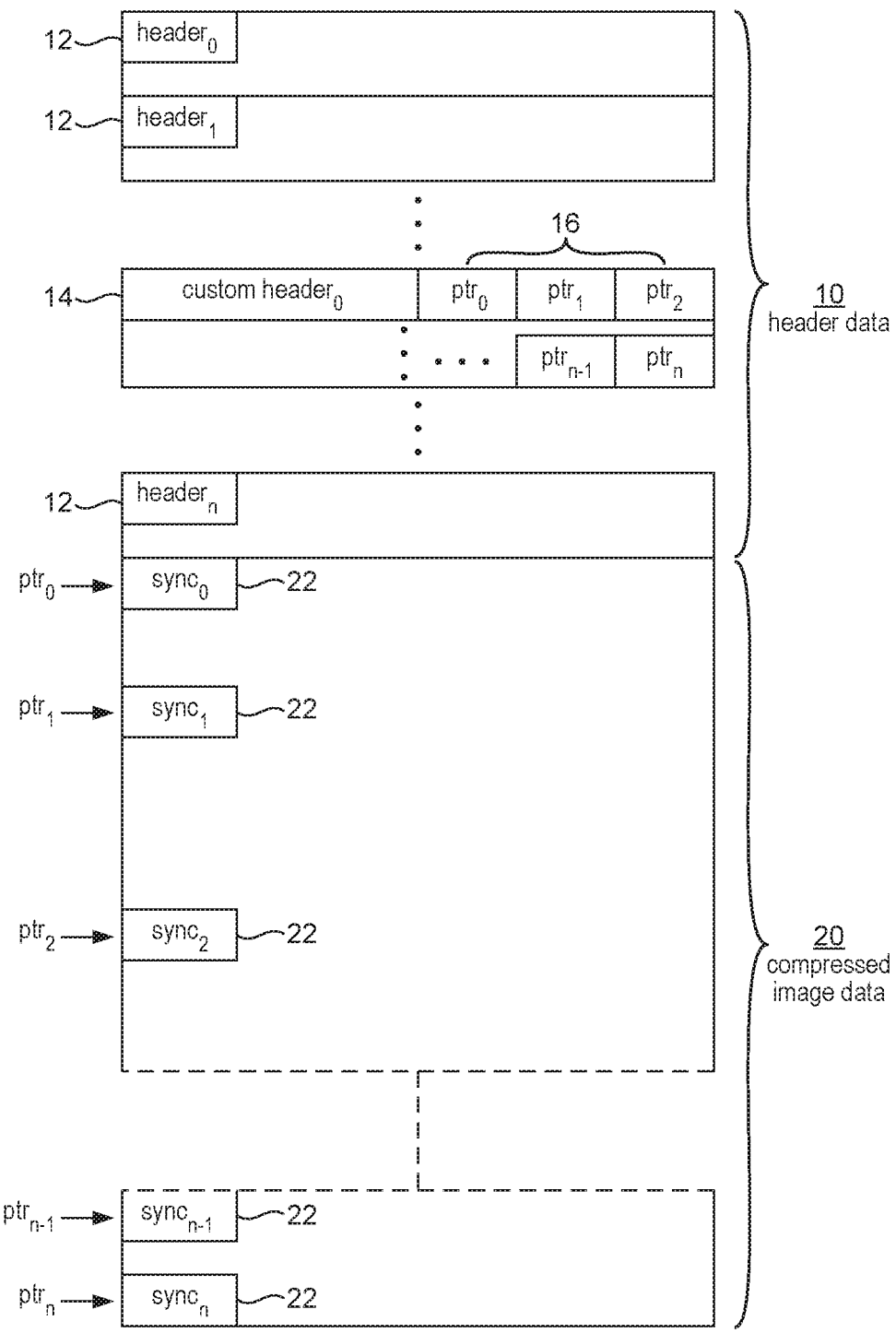
FIG. 1 shows schematically an example of the file structure containing a data stream that has been encoded according to embodiments of the technology described herein.

A first embodiment of the technology described herein comprises an apparatus for encoding an array of data elements, or a stream of such arrays, the apparatus comprising an encoder comprising:

an encoding circuit operable to, when encoding an array of data elements, or a stream of such arrays, encode the array(s) of data elements as a plurality of independent segments, wherein each independent segment can be decoded independently;

an output circuit operable to output an encoded data stream including the plurality of independent segments; and a header generating circuit operable to generate a header for output with an encoded data stream, the header containing information indicative of the location of each of the plurality of independent segments within the encoded data stream.

From another embodiment, there is provided a method for encoding an array of data elements, or a stream of such arrays, the method comprising steps of:

encoding the array(s) as a plurality of independent segments, wherein each independent segment can be decoded independently;

outputting an encoded data stream including the plurality of independent segments;

generating a header for output with the data stream, the header containing information indicative of the location of each of the plurality of independent segments within the data stream;

and outputting the header with the encoded data stream.

According to embodiments of the technology described herein, a data array, or stream of data arrays, is encoded as a plurality of independent segments each of which can be decoded independently of one another (and independently of any other data that is being encoded). The encoded data stream resulting from the encoding process is thus divided into a plurality of independently decodable segments. At the same time, e.g. during, or at the end of the encoding process, a header is generated containing information indicative of the location of each of the plurality of independently decodable segments within the encoded data stream (which will generally be referred to in the following as a "custom" header).

Thus, according to embodiments of the technology described herein, there is provided an encoded data stream comprising: a plurality of independent segments, each segment encoding part of an array of data elements, or part of a stream of such arrays, and each segment being independently decodable; and a header containing information indicative of the location of each of the plurality of the independent segments within the data stream.

In typical encoding schemes, at least some of the blocks in the source image data may be processed in dependence on another of the blocks within the image data, e.g. using a block-to-block prediction scheme (i.e. "intra-frame" compression). However, synchronisation or "restart" markers that act to reset the block-to-block predictor variables can be inserted into the data stream at periodic intervals, e.g. in order to provide means for recovery in the event of a transmission error. At each restart marker the dependency of the processing of the blocks is broken so that the encoded data stream is thereby divided into a number of independent segments that can be decoded independently of one another.

Similarly, when encoding streams of data arrays, such as in the case of encoding frames of video, a frame may be processed in dependence on the adjacent frames in the video sequence, e.g. using frame-to-frame predictions (i.e. "interframe" compression). However, the encoded video file as a whole is often divided into a number of independent slices (segments), i.e. sequences of frames that can be decoded independently of one another.

In such cases, because the encoded data stream includes a number of independent segments (e.g. sequences of blocks or frames), each of which is capable of being decoded independently, it would be possible for the data stream to be processed (decoded) in parallel. However, existing techniques for doing this can be inefficient.

By contrast, when a data stream that has been encoded in accordance with the technology described herein is to be decoded at a decoder (so long as the decoder is compatible with the encoding schemes presented herein), the decoder is able to read the custom header, and thereby identify the locations of each of the independent segments within the data stream. The decoder may thus be able to immediately start to process each (and any) of the individual independent segments, i.e. without having to first analyse the encoded data stream to identify the locations of the segments. Because each of the independent segments identified from the custom header can be immediately allocated to a respective buffer/core of the decoder, and because each of the independent segments can be decoded independently of one another, it will be appreciated that the provision of this header identifying the locations of the independent segments allows the data stream to be potentially decoded much more efficiently, e.g. using parallel processing techniques.

In conventional systems where such a custom header is not added to the data stream, even where the data stream comprises a plurality of independent segments that could be processed in parallel, before the decoder can allocate a buffer/core for processing the segments, the decoder would first have to analyse or search the data stream in order to identify the different segments. This step can require significant additional processing time and resource which can be avoided in the technology described herein.

Thus, it will be appreciated that the technology described herein allows for improved, more efficient (e.g. faster) processes for decoding an encoded data stream in order to recover the source data (e.g. image) that was originally decoded, at least for data arrays that have been decoded according to embodiments of the technology described herein. Accordingly, in embodiments, the technology described herein also extends to apparatuses and methods for decoding such data arrays.

Another embodiment of the technology described herein comprises an apparatus for decoding an encoded data stream, the apparatus comprising a decoder comprising:

A header reading circuit operable to, when receiving an encoded data stream including a plurality of independent segments each of which can be decoded independently and a header containing information indicative of the location of each of the plurality of independent segments within the data stream, read the header to identify the locations of the plurality of independent segments; and a decoding circuit operable to decode the identified plurality of independent segments.

Another embodiment of the technology described herein comprises a method for decoding an encoded data stream that includes a plurality of independent segments each of which can be decoded independently, the method comprising:

reading from a header associated with the encoded data stream, information indicative of the location of one of the independent segments within the data stream;

using the read header information to identify the location of the independent segment within the data stream;

reading the identified segment from the identified location in the data stream; and decoding the identified independent segment.

In any of the embodiments described herein the array(s) of data elements may take any desired and suitable form. In embodiments, the array(s) of data elements may (each) correspond to an array of data positions. In embodiments, the array(s) of data elements or positions may correspond to all or part of a desired (e.g. image) output, such as a still image or a video frame (e.g. for display). That is, the array(s) of data elements in embodiments comprise arrays of image data, i.e. data that may be used to generate an image for display. Thus, an array of data may in embodiments correspond to a single still image that is to be encoded. In other embodiments an array of data may correspond to a video frame of a stream of video frames that are to be encoded, in which case the technology described herein may be used either to encode a video frame (data array), or a stream of such video frames (data arrays). Although embodiments relate to data array(s) including image and/or video data, other examples of data array arrangements would be possible if desired and in general the array(s) of data elements may comprise any data array that can suitably or desirably be divided into a plurality of independently decodable segments.

There may be any desired and suitable correspondence between the data elements or positions and the desired output. Thus, the data elements or positions of the array(s) may each correspond to a pixel or pixels of a desired output. The array(s) of data elements can be any desired and suitable size or shape in terms of data elements or positions, but are in an embodiment rectangular (including square). The data elements may also have any desired and suitable format, for example that represents image data values (e.g. colour values).

In any of the embodiments described herein, the array(s) of data elements may be provided in any desired and suitable way. Embodiments may comprise generating (at least some or all of) the data elements of the array(s). Embodiments may also or instead comprise reading in (at least some or all of) the data elements of the array(s), e.g. from memory.

The data elements of the array(s) may be generated in any desired and suitable way. In embodiments, the data elements of the arrays may be generated by a camera such as a video camera. In other embodiments, generating the data elements of the arrays may comprise a rendering process. The rendering process may comprise deriving the data values represented by the data elements of the arrays (e.g. by rasterising primitives to generate graphics fragments and/or by rendering graphics fragments). A graphics processor (a graphics processing pipeline) may be used in order to generate the data elements of the arrays. The graphics processing pipeline may contain any suitable and desired processing stages that a graphics pipeline and processor may contain, such as a vertex shader, a rasterisation stage (a rasteriser), a rendering stage (a renderer), etc., in order to generate the data elements of the arrays.

When encoding the data array(s), the encoder is configured to encode the array(s) as a plurality of independent segments (e.g. so as to generate an encoded data stream including a plurality of such independent segments). As used herein, an "independent segment" is a segment of encoded data that is capable of being decoded independently i.e. individually, e.g. of the other segments in the data stream (and that therefore does not, e.g., require (depend on) any data from another segment in order to be decoded). For instance, each of the independent segments is capable of being decoded using a different processor (even though in practice it may not be).

In general, the independent segments may comprise segments of any desired size and quality, and the size of the segments may be defined essentially arbitrarily on the encoder side. For instance, the independent segments may be evenly sized, but need not be, and in embodiments, it is contemplated that the segments may have different sizes. Similarly, although the independent segments may typically be distributed evenly within the data stream, e.g. depending on the encoding scheme, other arrangements would be possible.

In embodiments, the independent segments may be aligned with, i.e. correspond to, one or more boundaries of the data array. For example, where the data array represents an image, the independent segments may be aligned with the image width (or height), so that the image is divided into a plurality of horizontal (vertical) "stripes", each of which can be processed independently. For example, the image may be processed on a stripe by stripe basis by moving horizontally (or vertically) along the image with each block of data elements being processed in dependence on the previous block in the stripe. It will be appreciated that the final block on one stripe (e.g. at the far right of the image) may bear little relation to the first block on the next stripe (e.g. at the far left of the image). Thus, dividing the image in this way (e.g. by inserting synchronisation or restart markers at the end of each stripe that act to reset the block-to-block predictor variables) will not significantly negatively impact the encoding process. In this case, the size of the stripes (e.g. in terms of data elements, or blocks) can be selected arbitrarily at the encoder, e.g. depending on the desired quality and size for the encoded image.

Thus, in an embodiment, each independent segment corresponds to all or part (e.g. half) of a row (or column) of the blocks that the data array has been divided into for encoding purposes.

Generating a (custom) header of the technology described herein may generally involve steps of identifying a location, e.g. a beginning (and optionally also an end or a size of the segment), of an independent segment within the data stream, and then adding information indicating the location, e.g. beginning, of the independent segment within the data stream to the header. This may be repeated for each identified independent segment during the encoding in order to build the custom header containing information indicating the location (e.g. beginning) of each of the independent segments within the encoded data stream. These steps will typically be performed by the encoder. For instance, the encoding circuit or circuitry of the encoder may, during the encoding of the array(s) of data elements, identify a beginning of an independent segment and then pass this information to the header generating circuit or circuitry for inclusion into the header. For example, when a new independent segment is identified during the encoding process, e.g. when a block is identified as being the first block of an independent segment, information about this may then be returned to the header generating circuit or circuitry. Alternatively, in some embodiments, the data array may be divided into independent segments before the encoding starts, e.g. with each segment being allocated a certain portion of the output buffer and the encoding then being performed to place each independent segment at a pre-allocated location within the data stream. In this case, the locations of the independent segments may be known already, and this information may thus be provided directly to the header generating circuit or circuitry. The locations of the independent segments may also be identified after the encoding is complete (e.g. by the header generating circuit or circuitry), e.g. by analysing the final encoded data stream. However, naturally, this will be less efficient than identifying the locations during the encoding.

The (custom) header contains information indicating the location of each of the independent segments within the encoded data stream. It is possible that each of the independent segments may therefore each be identified, and read, e.g. during a decoding process, using (only) the information contained in the header. Thus, in some cases, e.g. so long as the decoder is able to read and process the custom header, it may not be necessary for the independent segments to be delimited from each other within the encoded data stream, e.g. using synchronisation (or "restart") markers of the type mentioned above. In some embodiments, no such markers are provided within the encoded data stream. However, in embodiments, suitable markers are included within the data stream in order to delimit the independent segments. In this way, it may be ensured that the encoded data stream can still be processed by other decoders (that cannot read the custom header) and e.g. decoded in parallel using less efficient conventional techniques.

Thus, as mentioned above, in embodiments, the positions of the independent segments within the data stream may be identified by including suitable markers within the data stream. For instance, markers may be inserted into the data stream to indicate the beginning of each of the independent segments. The markers may generally comprise synchronisation or restart markers that act to delimit the different segments by breaking any processing dependencies between blocks of data elements in the encoded data stream. The start of each independent segment may thus, in embodiments, be indicated by a suitable synchronisation or restart marker included in the data stream. For example, where the encoding scheme uses block-to-block or frame-to-frame prediction, the independent segments may be defined by inserting synchronisation or restart markers into the data stream that act to reset the predictor variables used in the encoding scheme.

The encoding of the data array(s) as an encoded data stream including a plurality of independent segments may thus comprise a step of (the encoder) inserting synchronisation or restart markers into the data stream to indicate the start of each independent segment. That is, when generating an encoded data stream including a plurality of independent segments, the encoder may be operable to insert a marker into the encoded data stream to indicate the beginning of each independent segment.

Where used, the locations of these markers, and hence of the segments, may be used to generate the custom header indicating the locations of the independent segments within the data stream. That is, the header may indicate the locations of the independent segments within the data stream by indicating (e.g. by pointing to) the locations of these markers.

The encoding (e.g. compression) of the array(s) of data elements can be performed in any suitable and desired manner, e.g., in dependence on, and according to, the particular encoding scheme (e.g. standard) that is being used. For instance, in embodiments, and where the array(s) of data elements comprise image data, the encoding of the array(s) of data elements is in embodiments performed according to a JPEG scheme. In other embodiments, where the array of data elements comprises video data, the encoding of the array(s) of data elements may be performed according to a High Efficiency Video Coding (HEVC) scheme. However, it will be appreciated that other suitable data, image and/or video encoding schemes may be used as desired.

Typically, the data elements of the data array(s) may be encoded as "blocks" of data elements, e.g. on a block by block basis. For instance, the array(s) of data elements may be divided into plural source blocks to be encoded on a block by block basis (e.g. using the other blocks in the data array, or using blocks in adjacent data arrays in a sequence of data arrays). Thus, any reference herein to processing or encoding a data array or data elements of a data array should be considered to include, and typically involves, processing or encoding such blocks of data elements.

Because the (final) encoded data stream comprises a plurality of independent segments, this opens up possibilities for more efficiently encoding the data array(s) in parallel (i.e. using a parallel encoder). In general, a parallel encoder is any encoder, whether implemented as a processor, in software, or an encoding circuit or circuitry, etc., that is capable of simultaneously performing multiple processing actions. Thus, in embodiments, the encoder comprises a "multi-core" encoder including two or more processing cores (processing units) that are operable to, and in embodiments do, encode the data array(s) in parallel. Various suitable parallel processing techniques may be used to encode the data array(s) into an encoded data stream including a plurality of independently decodable segments.

For instance, in general, the result of the encoding process is that an encoded data stream is provided to an overall output buffer for outputting the encoded data stream (either to memory, or for transmission to an external device, etc.). However, the independent segments of the encoded data stream may be written to the overall output buffer in various ways.

For example, in some embodiments, a "stitched" encoding process may be used wherein a data array is encoded and written out in sequence to a single output buffer. Thus, a single output buffer may be allocated for the entire data array (or stream of arrays) that is being encoded. The data elements in the data array may then be processed by passing respective sets (e.g. blocks) of the data elements for encoding to one of a plurality of processing cores of a multi-core processor. The sets (blocks) of data elements may be passed to a processing core essentially in turn, e.g. so long as there is an available processing core, the next set (block) of data elements to be encoded in the data array(s) will be passed to that processing core for encoding. The encoded data from each of the processing cores may then be held in an internal buffer until all of the encoded data for an individual segment is present in the internal buffer, at which point the data for that segment may be assembled (stitched together) in decode order and written out to the output buffer.

According to the stitched encoding process, the sets (blocks) of data elements in the data array will typically be sent to the respective processing cores essentially in order with the internal buffer and stitching process being used to account for any differences in processing time associated with the different cores to ensure that the order is not lost when the data is written to the output buffer. Thus, a plurality of processing cores may process in parallel a plurality of data element sets (blocks) associated with the same independent segment. Once all of the data element sets (blocks) associated with an independent segment have been encoded, and are present in the internal buffer, the data element sets (blocks) for that segment may then be stitched together and the segment may be written out to the output buffer.

Thus, in an embodiment, the encoder (the encoding circuit or circuitry) may be configured to, when encoding a data array, or stream of data arrays: allocate an output buffer for the encoded data stream; pass data element sets (e.g. blocks) associated with an independent segment to a plurality of processing cores in parallel; pass the encoded data from each processing core to an internal buffer; when all of the encoded data for an independent segment is present in the internal buffer, stitch the encoded data for that independent segment together in order; and write out the stitched independent segment to the output buffer. In embodiments, the encoder (encoding circuit or circuitry) may thus comprise a plurality of processing cores operable in parallel, an internal buffer for processing the encoded data from the plurality of cores, and a stitch module for assembling the encoded data together in order for output to the output buffer to generate the data stream.

In some examples, the data array(s) may first be divided into a plurality of independent segments, and the data element sets (blocks) for each independent segment may be encoded in parallel, and then stitched together, before starting to process the next independent segment. However, it is also possible that all of the data element sets (blocks) in the data array may be encoded in parallel without first dividing the data array(s) into a plurality of independent segments, and the data stream may then be divided into independent segments during the stitching process and/or as the encoded data is written out to the output buffer. In this case, the internal buffer must temporarily hold the encoded data for an (and each) independent segment until all of the data for that segment is available before releasing the encoded data to the stitch module to be assembled. That is, the internal buffer is used to enforce the order of the encoded data so that it can be ensured that the stitch module that performs the stitching has all of the encoded data (e.g. for a given independent segment) so that this can then be written out in decode order to generate the independent segment for inclusion within the encoded data stream. The internal buffer thus acts with the stitch module to ensure that the encoded data is placed in the correct order into the data stream (e.g. if the different cores take different amounts of time to process the respective blocks).

In order to generate a custom header of the technology described herein, where the stitched encoding process is used, the encoding may also comprise a step of determining whether a data element set (block) that is being, or has been, encoded is the first data element set (block) in an independent segment. This determination may generally be performed by the stitch module that acts to stitch together the data for each segment and output a stitched independent segment to the output buffer. Where it is determined that the encoded data element set (block) is the first in an individually decodable segment, this information may be returned to the header generating circuit/circuitry for inclusion into the custom header. For instance, once the stitching process for an independent segment is complete, information indicating the location (and size of) the independent segment can be returned for use in generating the header. Also, a suitable marker may be inserted into the data stream at this point, as described above.

In this way, according to the stitched encoding process described above, the data elements of the data array(s) may be processed essentially in order, on a block by block basis, with adjacent blocks being encoded in parallel, and then written out in order (e.g. as independent segments) so as to assemble the data stream. The independent segments are therefore encoded and placed into the data stream substantially one after another. That is, the data element blocks for each of the independent segments are encoded in parallel, and the independent segment is then stitched together using the encoded data before it is written out into the data stream.

In another embodiment, the encoding of the array(s) of data elements may alternatively, or additionally, be performed in a "striped" manner wherein a plurality of independent segments are written out in parallel to an output buffer. In this process, before the encoding starts, each of the independent segments may be allocated a respective portion of the output buffer. Because each independent segment is pre-allocated a portion of the output buffer, each of the independent segments can be written out to its respective portion of the output buffer regardless of the processing of the other segments. Each of the independent segments may therefore be assigned to a respective processing core of a multi-core processor for encoding and the encoded data then written from the processing core to the respective portion of the output buffer. An intermediate buffer may e.g. be provided between the processing cores and the output buffer, if desired. However, in embodiments, the independent segments may be written directly from the processing cores to the respective portions of the output buffers. Because the order that the segments are placed in the output buffer is determined by the pre-allocation of the respective portions, it is ensured that the segments will be written in correct (decode) order.

In a variation on this, instead of allocating a portion of a single output buffer to each segment, each of the independent segments may be allocated to a respective output buffer of a plurality of output buffers. The plurality of output buffers may e.g. be provided upstream of the ultimate output buffer. In this case, after the independent segments have been written (directly) to the respective output buffers, the respective output buffers can then write out in turn the independent segments (e.g. to the ultimate output buffer) to assemble the encoded data stream. It will be appreciated that writing a plurality of independent segments to respective output buffers of a plurality of output buffers, although increasing the required number of output buffers compared to writing a plurality of independent segments to respective portions of a single output buffer, may help to reduce or avoid the need to strictly control the size of the compressed data for each segment to fill the allocated portion of the output buffer.

Thus, in embodiments, the encoder (encoding circuit/circuitry) may be configured to, when encoding a data array, or stream of data arrays: divide the data array(s) into a plurality of independent segments (e.g. image "stripes"); allocate a respective output buffer, or portion of an output buffer, for each of the plurality of independent segments; and write the encoded data for each independent segment to the respective allocated output buffer or buffer portion to generate the data stream for output. That is, the data array(s) may be initially divided into a plurality of independent segments (or image stripes). Each of these independent segments can be allocated a dedicated output buffer, or output buffer portion, so that each independent segment can be encoded entirely independently of, and in parallel with, the other segments. For instance, the encoder may assign each independent segment to a respective core of a multi-core processor. By contrast to the stitched encoding process discussed above, an independent segment may thus written to the output buffer(s) in any order (i.e. since the order is fixed by the order of the pre-allocated output buffer(s) (portions)). When the independent segments are allocated a portion of a single output buffer, the data stream may be written directly in the output buffer. When the independent segments are allocated respective output buffers, the final data stream can then be generated e.g. by writing out the independent segments from each of the respective plurality of output buffers, or by assembling together the plurality of encoded segments provided by the respective plurality of output buffers in a final output buffer.

Before, or during, the writing of each encoded segment to a respective output buffer, a suitable marker may be inserted at the beginning of that segment so that when the individually encoded segments are combined into an encoded data stream the markers act to delimit the segments from one another, e.g. in the manner described above.

Furthermore, according to the striped encoding process, where any segment is at risk of overflowing its respective portion of the output buffer (or its respective output buffer), the encoding of that segment may be throttled, e.g. by starting to discard high frequency content. For instance, each of the independent segments may be allocated a certain amount of space in the output buffer, and where there is a risk of generating a data stream that is too large for the buffer, e.g. so that an independent segment would overflow its allocated output buffer (portion), the encoding process may start discarding detail during the encoding of the blocks within that segment (so as to reduce the amount of encoded data that will be generated for the segment in question).

For example, where, where there is a risk of generating a data stream that is too large for the respective output buffer (portion), the encoder may start discarding high frequency detail e.g. by inserting end of block syntax elements into the data stream to terminate the block(s) early. Thus, in embodiments, the encoding circuit/circuitry may be configured to (while writing encoded data for an independent segment to a respective allocated output buffer or buffer portion to generate a data stream for output), when it is determined that there is a risk of the data for an independent segment overflowing its respective allocated output buffer or buffer portion, start to discard information during the encoding of the data for that independent segment. Thus, there may be a step of determining whether there is a risk of the data for an independent segment overflowing its respective allocated output buffer or buffer portion and, when it is determined that there is a risk of the data for an independent segment overflowing its respective allocated output buffer or buffer portion, starting to discard (and discarding) information during the encoding of the data for that independent segment. Where information is to be discarded, then in embodiments visually unimportant and/or high frequency information is (in embodiments) discarded.

Each independent segment may be allocated the same output buffer size (or same amount of space in a single output buffer), e.g. by dividing a target (buffer) size by the number of segments. However, it is also contemplated that the buffer sizes for each segment may be allocated based on the content of the data array that is being encoded. For example, if it is known that certain areas of the data array are relatively less detailed, so will take up less space, those areas may be allocated a lower buffer size. (This may be the case, for example, when the data array represents an image, for areas of the image that show little variation, e.g. areas of sky or grass.) On the other hand, if it is known that certain areas contain a high amount of detail, so that higher frequencies and larger sizes will be required to accurately encode those areas at the desired quality, such areas may be allocated a larger buffer size.

Similar techniques may also be used when the encoding is performed according to a stitched process as described above. For example, in that case, the encoder may allocate a certain amount of buffer space for each of the blocks that is being processed, and where there is a risk of generating a data stream that is too large for the buffer, the encoding process may start discarding detail during the encoding of the blocks.

Thus, the encoder may in embodiments be designed to prevent overflowing of the output buffer(s) used in the encoding process for generating and outputting the encoded data stream. For instance, in embodiments, the encoder is operable to constrain the size of the encoded data stream to (or below) a target buffer size, e.g. to prevent overflowing an output buffer used for the encoded data stream. Thus, in embodiments, the encoder is configured to allocate a target buffer size for the encoded data stream, and the encoding of the array(s) of data elements is performed such that the buffer size of the encoded data stream is constrained to the target buffer size. The target buffer size may e.g. be set based on knowledge of the actual buffer size used in the encoder, or based on a desired maximum file size.

Variations on the encoding schemes described above are also contemplated. For instance, the data array(s) may be initially divided into a plurality of independent segments that are then each allocated to a different core and processed in parallel, without allocating each segment a separate output buffer (portion). In that case, when each segment is encoded, the encoded segment data may be passed to an internal buffer and/or stitching module as described above in order to assemble the segments in the correct (decode) order in the output data stream.

In embodiments, each of the independent segments is aligned to a (predefined) data unit boundary within the data stream. The data unit may generally be a type or size of data unit that the system is configured to handle or process in a single operation, e.g. the data unit may be a "word". For instance, where the locations of the independent segments in the data stream are defined using a marker, as discussed above, the markers may be aligned with a particular data unit (e.g. word) boundary in the data stream. The encoder may thus be operable to perform data structure padding to align the independent segments (and/or markers) to a particular data unit, e.g. byte or word, in the data stream. Thus, the encoding of the data array(s) may comprise a step of (the encoder) inserting dummy bytes into the data stream in order to align the independent segments with a data unit, e.g. word, boundary.

Performing such data structure alignment may provide various benefits on both the encoding and decoding side. For instance, when the locations of the independent segments are aligned with to a data unit, e.g. word, boundary, this allows the custom header to be simplified or reduced in size, since the header can simply indicate (e.g. point to) a particular data unit or data unit boundary, e.g. a particular word or word boundary, rather than having to point to a single byte, and without e.g. having to perform byte shuffling. Thus, the decoding process may be simplified. Similarly, aligning the segments to boundaries may help to simplify any stitching processes used during (parallel) encoding of the data array(s).

However the encoding is performed, whether by a stitched or striped process as described above, or by any other suitable parallel or non-parallel process, at the end of the encoding process, an encoded data stream is generated containing a plurality of independent segments along with a custom header indicating the location of each of the segments in the encoded data stream.

The information indicating the location of the independent segments within the data stream may in principle be provided as part of a single header along with any other information that is required or desired to be provided with the encoded data stream, e.g. according to the encoding scheme (e.g. standard) being used, e.g. including information indicating the start/end of the data, the size of the data array, the number of components, the sampling factors, etc.

However, in embodiments the custom header is a separate header that is provided additionally to any standard headers that are provided or required as part of the encoding scheme. Although they are not used for this purpose, such additional headers are often provided as options for the user as part of the encoding scheme (e.g. standard), e.g. the JPEG codec allows for the use of such additional headers. Thus, it will be appreciated the technology described herein can be implemented using existing encoding schemes or standards. In this way, if the decoder is not compatible with the technology described herein, i.e. cannot read the custom header, the decoder is able to ignore the custom header and is thus still able to process the data stream, e.g. in a conventional way.

The (custom) header of the technology described herein may comprise a plurality of pointers, each pointer pointing to a location of an independent segment within the data stream or to a marker defining the start of an independent segment. The pointer may point e.g. either to an absolute data unit (e.g. byte or word) reference, or to an offset from the start of the data stream. In embodiments, the independent segments are aligned with a data unit (e.g. a byte or word), which may help to reduce the size and complexity of the header.

The encoded data stream generated by the encoder may be output to a memory for storage (e.g. for subsequent decoding and/or transmission) or may be output to an external device (e.g. for subsequent decoding and optionally display).

The decoder, upon receipt of an encoded data stream of the type described above, i.e. including a plurality of independent segments each of which can be decoded independently and a header containing information indicative of the location of each of the independent segments, is thus able to read the custom header to identify the locations of the plurality of independent segments, and thereby decode the segments. That is, the decoding circuit/circuitry of the decoder is operable to identify the locations of each of a plurality of (e.g. all of the) independent segments within the encoded data stream, and decode each of the identified independent segments. For instance, the decoder may allocate a core for decoding each identified independent segments. The core(s) may then write out the decoded segment to an output image buffer. In embodiments, the decoder is configured to decode the data stream in parallel. For example, and in embodiments, the decoder is configured to allocate the independent segments to one of a plurality of cores of a multi-core processor. Thus, the use of such custom headers may simplify and speed up the decoding process.

Once the data stream has been decoded, the decoder may then be configured to display, or output for display, data obtained using the decoded independent segments. In general, the decoder is operable to decode the data stream to recover the original source data (e.g. image) that was encoded, and then use (e.g. display) this data as desired.

As mentioned above, if the decoder is not compatible with a data stream that has been encoded according to the technology described herein, the decoder is generally able to ignore the custom header. However, it will be appreciated the data stream will typically still be divided into a plurality of independent segments, so that the encoded data stream may still be processed in parallel (e.g. using conventional less efficient techniques).

The encoding and decoding apparatuses discussed above may generally be provided as part of a data processing system. For example, the apparatuses may comprise part of an image and/or video processing system that includes a camera, such as a digital camera, mobile phone or tablet. It will be appreciated that the technology described herein may, in embodiments, provide certain system advantages. For instance, embodiments of the technology described herein may allow for optimised hardware solutions, e.g. relating to integrated systems (such as digital cameras or mobile phones or tablets) including both an encoder and decoder, where it can be guaranteed that the custom header will be provided and that the decoder is able to read the custom header. It will be appreciated that in such cases the encoding and decoding processes may be performed highly efficiently.

A further embodiment of the technology described herein comprises a data processing system comprising:
  an encoder comprising:
    an encoding circuit operable to, when encoding an array of data elements, or a stream of such arrays, divide the array(s) into a plurality of independent segments, wherein each independent segment can be decoded independently;
    an output circuit operable to output an encoded data stream including the plurality of independent segments; and
    a header generating circuit operable to generate a header for output with the data stream containing information indicative of the location of each of the plurality of independent segments within the data stream; and a
  decoder comprising:
    an input circuit operable to receive an encoded data stream including a plurality of independent segments;
    a header reading circuit operable to read a header containing information indicative of the location of each of the plurality of independent segments within the data stream to identify the locations of the plurality of independent segments; and
    a decoding circuit operable to decode the plurality of independent segments.

Another embodiment of the technology described herein comprises a method of processing data comprising:
  encoding an array of data elements, or a stream of such arrays, as a plurality of independent segments, wherein each independent segment can be decoded independently;
  outputting an encoded data stream including the plurality of independent segments;
  generating a header for output with the data stream containing information indicative of the location of each of the plurality of independent segments within the data stream;
  outputting the header with the encoded data stream;
  receiving the encoded data stream and the header at a decoder;
  reading the header and identifying the locations of the plurality of independent segments; and
  decoding the plurality of independent segments.

In general, the processes described herein in any embodiment may be performed by any desired and suitable apparatus. For example, the processes described herein in any embodiment may be performed by an image or video processor (codec). The data processing apparatus described herein in any embodiment may therefore comprise or may be a video processor. Thus, the processing (encoding/decoding) circuits, output circuit, header generating circuit, header reading circuit or input circuit, etc. described herein in any embodiment may form part of a video processor. The data processing apparatus described herein in any embodiment may comprise, or may be, or may form part of, a system on chip (SoC).

As will be appreciated by those skilled in the art, the encoding/decoding apparatus of the technology described herein may be part of an overall data processing system that includes, for example, a host (e.g. central) processor. The host processor may, for example, execute applications that require data processing by the encoding/decoding apparatus. The host processor may send appropriate commands and data to the encoding/decoding apparatus to control it to perform the data encoding/decoding operations and to generate and/or use an output required by applications executing on the host processor. To facilitate this, the host processor may execute a driver for the encoding/decoding apparatus.

In embodiments, the apparatus or system may comprise, and/or may be in communication with, one or more memories and/or memory devices that store the data described herein, and/or store software for performing the processes described herein. The apparatus or system may comprise, and/or may be in communication with a display for displaying images based on the data elements of the arrays. The apparatus or system may comprise, and/or may be in communication with a camera that generates the arrays of data elements.

The memory referred to herein may be any desired and suitable memory of or for the data processing apparatus. The memory may be external to the data processing apparatus, e.g. video processor and/or system on chip (SoC). The memory may be, for example, main system memory.

The technology described herein can be used for all forms of data arrays that a data processing apparatus may provide and/or use, such as images or frames for display. Thus, as indicated above, the arrays of data elements may comprise image data and/or may correspond to images or frames of image data.

The technology described herein can correspondingly be used with and for any suitable and desired encoding (e.g. image or video encoding) scheme and standard. In an embodiment, it is used with and for the JPEG encoding standard.

In an embodiment, the various functions of the technology described herein are carried out on a single data (e.g. image) processing platform that provides and/or uses the arrays of data elements.

The technology described herein can be implemented in any suitable system, such as a suitably configured computer or micro-processor based system. In an embodiment, the technology described herein is implemented in a computer and/or micro-processor based system.

The various functions of the technology described herein can be carried out in any desired and suitable manner. For example, the steps and functions of the technology described herein can be implemented in hardware or software, as desired. Thus, for example, unless otherwise indicated, the various circuits, circuitry, functional elements, and stages of the technology described herein may comprise a suitable processor or processors, controller or controllers, functional units, circuits/circuitry, processing logic, microprocessor arrangements, etc., that are operable to perform the various steps or functions, etc., such as appropriately dedicated hardware elements (processing circuits/circuitry) and/or programmable hardware elements (processing circuits/circuitry) that can be programmed to operate in the desired manner.

In particular, it is contemplated that the encoder may be implemented either in hardware or software, as desired. Thus, for example, the encoder may comprise a suitable processor or processors, controller or controllers, functional units, (encoding) circuits/circuitry, processing logic, microprocessor arrangements, etc., that are operable to perform the various encoding steps or functions, etc., as described herein such as appropriately dedicated hardware elements (processing circuits/circuitry) and/or programmable hardware elements (processing circuits/circuitry) that can be programmed to operate in the desired manner.

Similarly, the decoder can be implemented in hardware or software, as desired. Thus, for example, the decoder may comprise a suitable processor or processors, controller or controllers, functional units, (decoding) circuits/circuitry, processing logic, microprocessor arrangements, etc., that are operable to perform the various encoding steps or functions, etc., as described herein such as appropriately dedicated hardware elements (processing circuits/circuitry) and/or programmable hardware elements (processing circuits/circuitry) that can be programmed to operate in the desired manner.

The various steps or functions, etc., of the technology described herein may be duplicated and/or carried out in parallel on a given processor. Equally, the various processing stages may share processing circuits/circuitry, etc., if desired.

Subject to any hardware necessary to carry out the specific steps or functions, etc., discussed above, the system can otherwise include any one or more or all of the usual functional units, etc., that data processing apparatus and/or systems include.

The various data processing stages can accordingly be implemented as desired and in any suitable manner, and can perform any desired and suitable functions, respectively. Similarly, the various data can be defined and stored in any suitable and desired manner.

It will also be appreciated by those skilled in the art that all of the described embodiments of the technology described herein can, and in an embodiment do, include, as appropriate, any one or more or all of the features described herein.

The methods in accordance with the technology described herein may be implemented at least partially using software e.g. computer programs. Thus, further embodiments the technology described herein comprise computer software specifically adapted to carry out the methods herein described when installed on a data processor, a computer program element comprising computer software code portions for performing the methods herein described when the program element is run on a data processor, and a computer program comprising code adapted to perform all the steps of a method or of the methods herein described when the program is run on a data processor. The data processor may be a microprocessor system, a programmable FPGA (field programmable gate array), etc.

The technology described herein also extends to a computer software carrier comprising such software which when used to operate a data processing apparatus or system comprising a data processor causes in conjunction with said data processor said apparatus or system to carry out the steps of the methods of the technology described herein. Such a computer software carrier could be a physical storage medium such as a ROM chip, CD ROM, RAM, flash memory, or disk, or could be a signal such as an electronic signal over wires, an optical signal or a radio signal such as to a satellite or the like.

It will further be appreciated that not all steps of the methods of the technology described herein need be carried out by computer software and thus in further embodiments comprise computer software and such software installed on a computer software carrier for carrying out at least one of the steps of the methods set out herein.

The technology described herein may accordingly suitably be embodied as a computer program product for use with a computer system. Such an implementation may comprise a series of computer readable instructions either fixed on a tangible, non-transitory medium, such as a computer readable medium, for example, diskette, CD, DVD, ROM, RAM, flash memory, or hard disk. It could also comprise a series of computer readable instructions transmittable to a computer system, via a modem or other interface device, either over a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink wrapped software, preloaded with a computer system, for example, on a system ROM or fixed disk, or distributed from a server or electronic bulletin board over a network, for example, the Internet or World Wide Web.

The drawings show elements of data processing apparatuses and systems that are relevant to embodiments of the technology described herein. As will be appreciated by those skilled in the art there may be other elements of the data processing apparatus and system that are not illustrated in the drawings. It should also be noted here that the drawings are only schematic, and that, for example, in practice the shown elements may share significant hardware circuits, even though they are shown schematically as separate elements in the drawings (or, conversely, where elements are shown as sharing significant hardware circuits, these may in practice comprise separate elements).

As discussed above, embodiments of the technology described herein relate to encoding array(s) of data elements. It will be appreciated that the concepts described herein can generally be applied to any suitable and desired contexts in which arrays of data are to be encoded. For instance, and in embodiments, the technology described herein may generally be applied to various types of image or video files. Similarly, the concepts described herein may be implemented using any suitable and desired encoding (compression) scheme. However, various embodiments of the technology described herein will now be described in the context of the encoding image data, and particularly with regard to encoding image data according to the JPEG encoding scheme.

FIG. 1 shows schematically an example of a file structure representing an encoded image that may be used (or generated) according to embodiments of the technology described herein. The encoded file comprises header data 10 placed at the beginning of the file which may generally be used to give information about the start/end of the image, the image's size, the image width/height, the image resolution, number of colours, etc., e.g. depending on, and according to, the JPEG codec being used. The header data 10 is followed in the data stream by a stream of compressed image data 20 which, as shown, comprises a stream of data including a series of restart markers 22 (i.e. sync0, sync1, ... syncn) that act to divide the compressed image data 20 into a plurality of independently decodable segments. That is, the restart markers 22 act in a known manner to reset the block-to-block predictor variables used by the JPEG codec so that each segment of data between adjacent restart markers 22 is capable of being processed (decoded) independently of the other segments.

In particular, as shown in FIG. 1, the header data 10 includes one or more standard headers 12 including whatever information as may be required by the JPEG encoding scheme (such as information indicating the start and end of the image, the image width and height, etc., as mentioned above). However, according to the technology described herein, an additional custom header 14 is included that contains a series of pointers 16 (ptr0, ptr1, . . . , ptrn), pointing respectively to a corresponding one of the restart markers 22 included within the data stream. When the file is to be decoded, a decoder may thus first read the header data 10, including the custom header 14, to thereby identify the locations of the restart markers 22. The independent segments defined by the restart markers 22 may thus be immediately allocated to a decoding core and put out for decoding entirely independently of one another.

FIG. 1 thus shows an encoded data stream including a plurality of independent segments (defined between respective restart markers 22) and a custom header containing corresponding pointers 16 indicating the location of each of these segments (particularly, the location of each of the markers 22) within the data stream. In general, any suitable encoding scheme may be used to generate a data structure like that shown in FIG. 1. However, the division of the data stream into separate, independently decodable sections advantageously opens up various parallel encoding schemes that may be used to efficiently encode the data array.

One example of a so-called "stitched" encoding process that may be used according to some embodiments of the technology described herein will now be described in relation to FIGS. 2 to 4. In this process, the source image data is processed essentially in block order, with adjacent blocks being encoded in parallel. The encoded data is then stitched together and written out in decode order into a single output buffer to form the final data stream.

Figure 2:
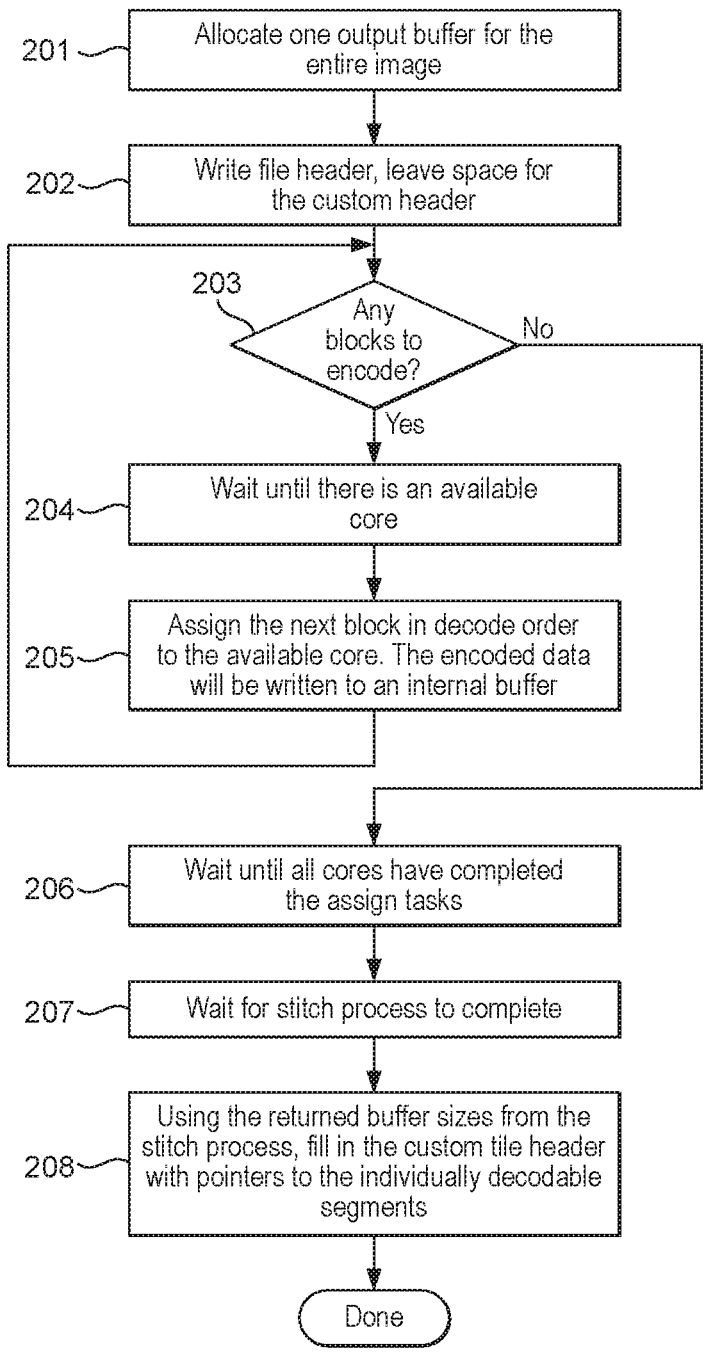
FIG. 2 is a flowchart illustrating an example of a "stitched" encoding process that may be used to generate an encoded data stream, e.g. of the type shown in FIG. 1, according to an embodiment of the technology described herein.

FIG. 2 is a flowchart illustrating the main flow of the stitched encoding process. The general flow is illustrated schematically in FIG. 3 which shows how a source image 301 stored within external RAM 30 can be processed using a multi-core encoder 32 according to the stitched encoding process set forth in FIG. 2. As shown, the multi-core encoder 32 comprises a plurality of cores 320 for encoding the data elements within the source image 301, an internal buffer 322 for processing the data from the cores 320 and a stitch module 324 for performing a stitch process and providing the stitched (encoded) elements to an output buffer 302 (here, also within the external RAM 30).

Figure 3:
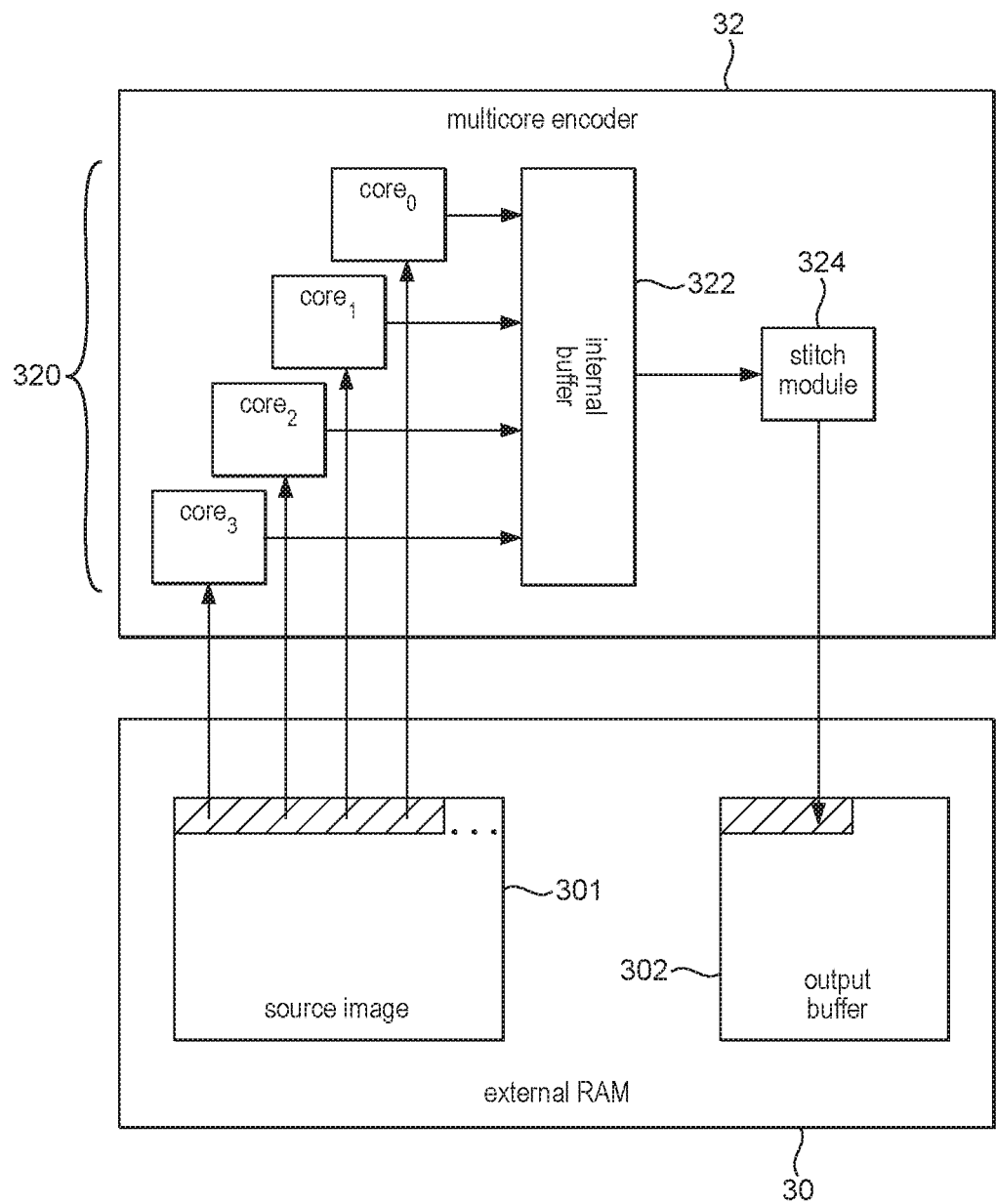
FIG. 3 shows schematically the operation of the stitched encoding process that is illustrated in FIG. 2.

Thus, referring to FIG. 3, the process in FIG. 2 starts by allocating one output buffer 302 for the entire source image (step 201). The file header 10 is then written, leaving space for a custom header 14 as described above (step 202). The process then proceeds to encode the image 301 on a block by block basis. Where there is a block to encode (step 203), and so long as there is an available encoding (processing) core of the cores 320 of the multi-core encoder 32 (otherwise the process waits until a core becomes available (step 204)), the next block in decode order is assigned to the available encoding core (step 205). Once the data has been encoded, the encoded data is then written from the core to an internal buffer 322 of the system, and that core is made available for processing the next block. The data from the internal buffer 322 is then passed to a stitch module 324 which acts to stitch the encoded blocks together in order as a series of individually decodable segments. For instance, once all of the data for a given segment has been encoded and is available in the internal buffer 322, this data may then be passed to the stitch module 324 for assembling that segment so that it can be written to the output buffer 302. The stitching process performed by the stitch module 324 is illustrated in more detail in FIG. 4. The process continues until there are no blocks left to encode. For instance, once all of the cores 320 have completed their assigned tasks (step 206), and once the stitch process is complete (step 207), the sizes for each of the individually decodable segments are returned from the stitch module 324, and used to fill in the custom file header with pointers to the individually decodable segments (step 208).

Figure 4:
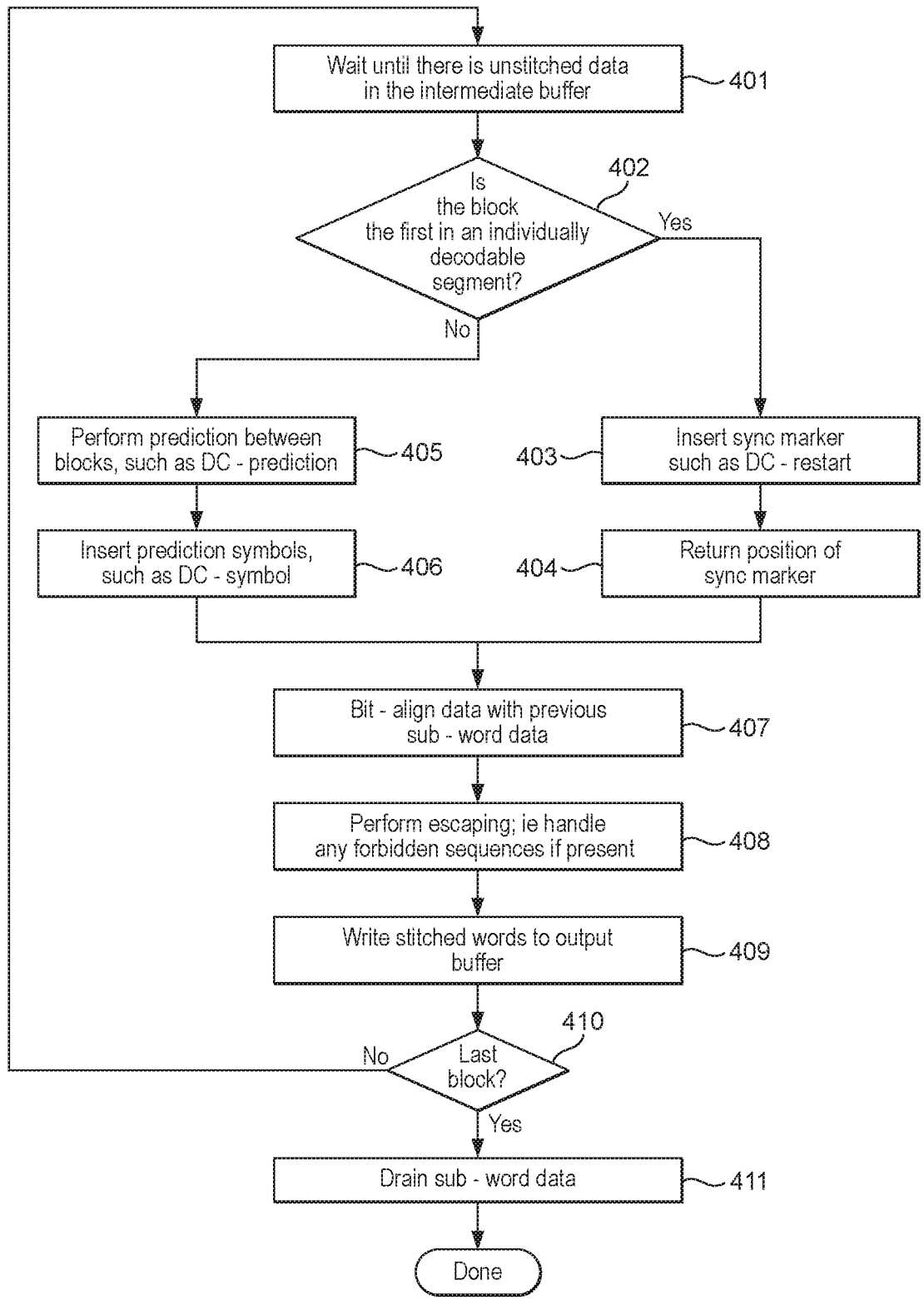
FIG. 4 is a flowchart illustrating a stitching process for use within the stitched encoding process of FIG. 2.

As shown in FIG. 4, the stitch process starts when it is determined that there is unstitched data available in the intermediate internal buffer 322 (step 401). For instance, a signal indicating this may be sent from the internal buffer 322 to the stitch module 324. Alternatively, or additionally, the stitch module 324 may be configured to periodically check the internal buffer 322 for unstitched data. The unstitched data (i.e. an encoded block) is then passed to the stitch module 324 for stitching. It is first checked whether the block is the first block in an individually decodable segment (step 402). If the block is the first block in an individually decodable segment, a synchronisation marker such as a DC-restart marker (for the JPEG codec) is inserted into the data stream (step 403) and the position of the marker is returned so that it may be written into the custom header (step 404). On the other hand, where the block is not the first block in an individually decodable segment (i.e. where the block is within a segment), block to block prediction is performed according to whatever encoding scheme is being used (e.g. JPEG) (step 405) and appropriate prediction symbols are inserted into the data stream (step 406) so that when the encoded data stream is subsequently being decoded the decoder can perform the required block-to-block predictions using the other blocks in that segment. In both cases, the resulting encoded data for that block is then bit-aligned with the previous sub-word data (i.e. block or marker) (step 407). An (optional) escaping process may then be performed, e.g. to handle any forbidden sequences if present (step 408). The stitched words for each segment are then written out in order from the stitch module 324 to the output buffer 302 (step 409). Once the last block has been processed (step 410), the sub-word data is drained (step 411) and the stitch process is complete.

The encoder may align itself to, for example, some programmable word element in order to simplify the stitching process. For example, in a JPEG scheme, this may be done by inserting "stuffing" (dummy) bytes into the data stream in order to pad the encoded data. In embodiments, such data alignment may be performed to align each of the independent segments to a word boundary. For example, when it is determined that the block is the last block in an individually decodable segment, but the segment is not aligned to a word boundary, the encoder may insert stuffing bytes into the data stream in order to align the segment with the next word boundary. This may also generally help (even when not using a stitching process) to reduce the size of the custom header. For instance, it is generally simpler (thus requiring less size) to point to a word-aligned marker, than it would be to point to an arbitrary byte within the data stream. Similarly, if the decoder knows that each independent segment is word-aligned, this may simplify the decoding process, as there is no need to first check this.

Figure 5:
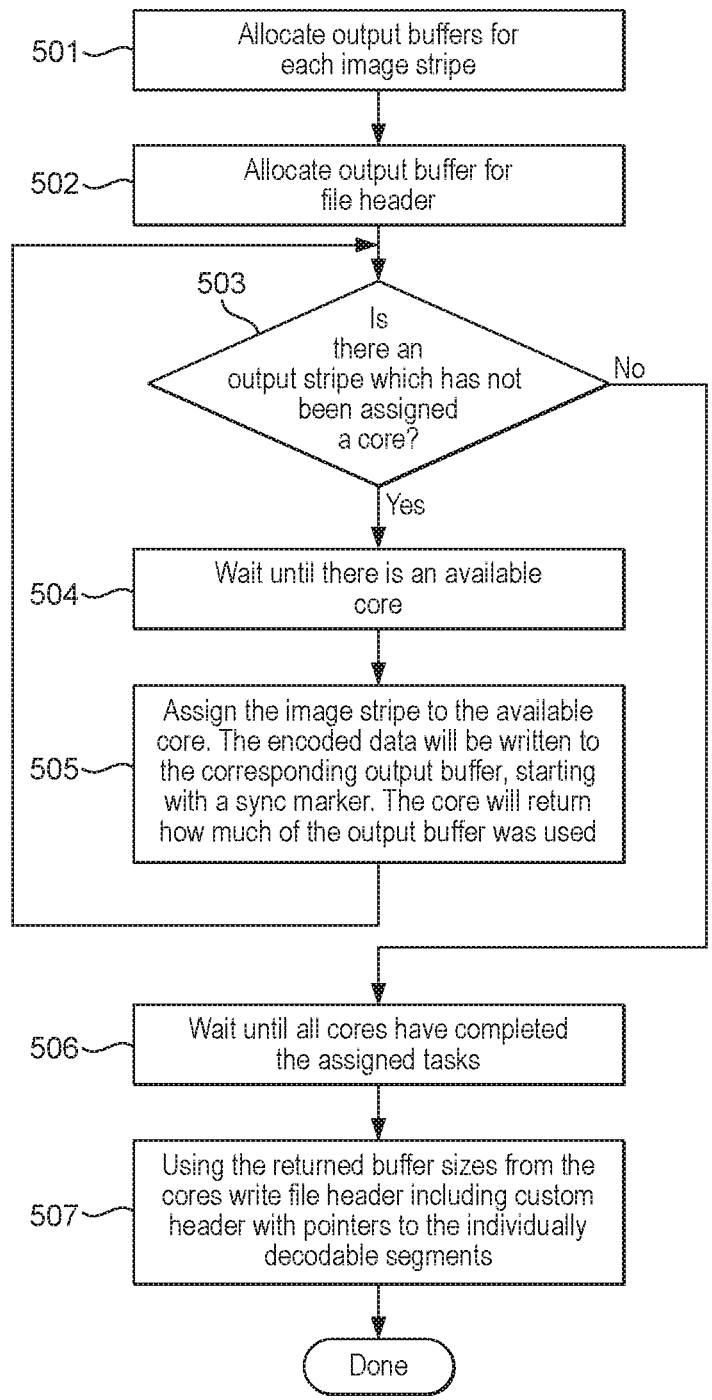
FIG. 5 is a flowchart illustrating an example of a "striped" encoding process that may be used to generate an encoded data stream, e.g. of the type shown in FIG. 1, according to another embodiment of the technology described herein.
Figure 6:
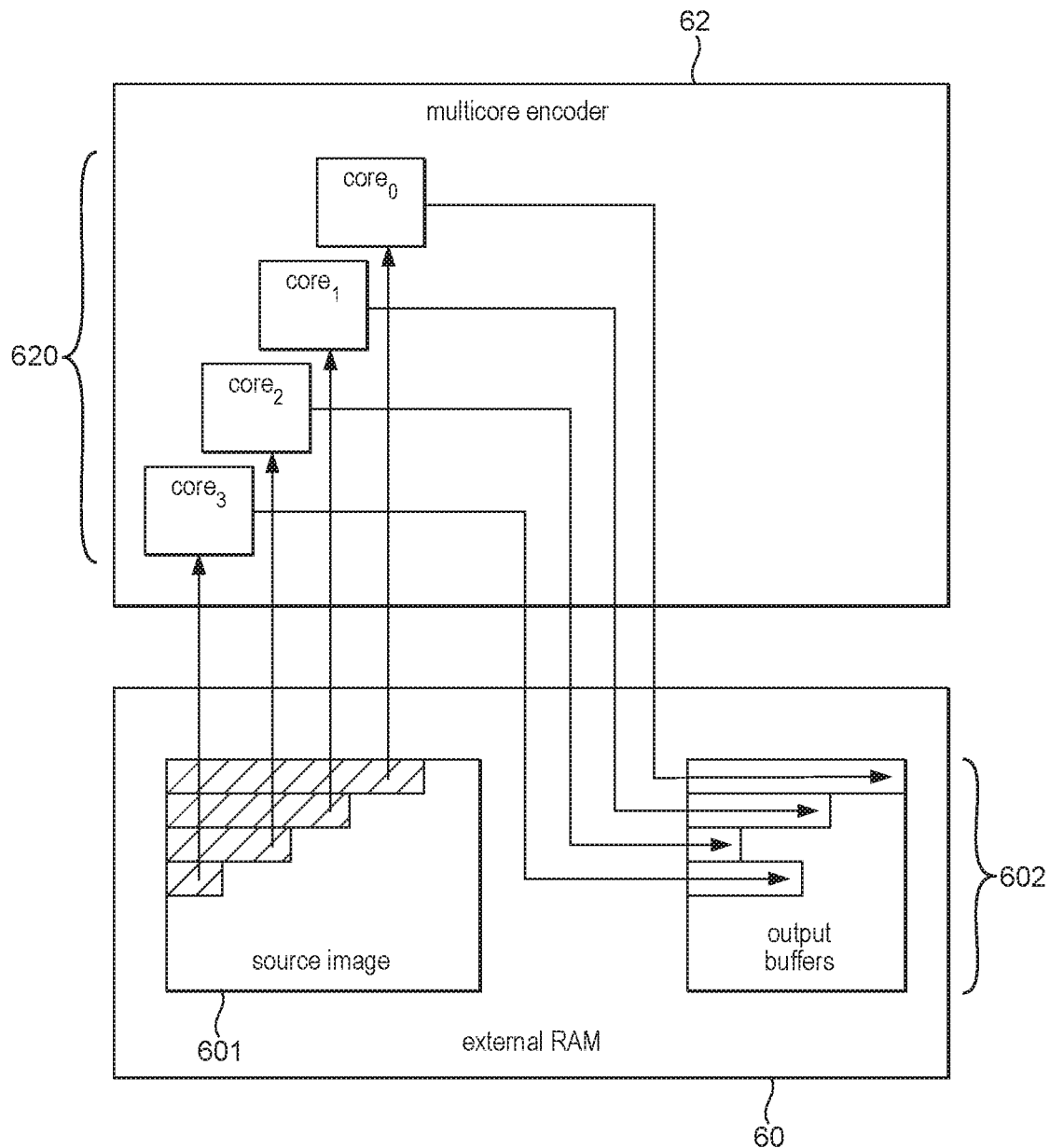
FIG. 6 shows schematically the operation of the striped encoding process illustrated in FIG. 5.

In other embodiments, the data array may be encoded using a so-called "striped" encoding process, as illustrated in FIGS. 5 & 6. As shown schematically in FIG. 6, the flow involves generally similar components to those shown in FIG. 3, except that now there is no internal buffer 322 or stitching module 324 (although such components may be used, if desired, depending on the implementation). Instead, a plurality of cores 620 of a multi-core encoder 62 are operable to write directly to a plurality of output buffers 602 provided in the external RAM 60. According to the striped encoding process, the source image 601 is first divided into a plurality of "stripes", each of which is allocated an individual output buffer from the plurality of output buffers 602. Thus, the process shown in FIG. 5 starts by allocating an output buffer for each image stripe (step 501). A further output buffer is then allocated for the file header (step 502). It is then determined whether there is a stripe to be output that has not yet been assigned a core (step 503). Where there is an output stripe that has not been assigned a core 620, so long as there is an available core (otherwise the process waits until a core becomes available (step 504)), the image stripe is assigned to the available core and the encoded data can then be written from the core to the corresponding (allocated) output buffer, starting with a sync marker (step 505) and the encoded segments from each output buffer may then be consolidated to form the final data stream, e.g. by passing the segments from each output buffer to a final output buffer. The core will also return information indicating how much of the output buffer was used. After waiting until all of the output stripes have been assigned a core, and all of the cores have completed their assigned tasks (step 506), the file header, including the custom header, can be written using the returned buffer sizes from the cores (step 507), and the encoding process is thus complete.

Again, the encoder may be configured to perform data structure padding in order to align the independent segments with word-boundaries. For instance, during the encoding and writing out of each of the independent segments to the output buffer, the encoder may insert stuffing bytes into the data stream to pad out each independent segment before the segments are combined together in the final data stream.

When a striped encoding process like that shown in FIGS. 5 & 6 is used, the encoder may be designed to (try to) guarantee not to overflow the output buffers. For instance, each of the independent segments may be allocated a certain output buffer size, and the encoder may start to discard detail when it is determined that there is a risk of generating a data stream that is too large for the output buffer. For example, the encoder could discard high frequency content by inserting an end of block syntax element into the data stream, although other options would also be possible, e.g. depending on the encoding scheme being used. This may be done arbitrarily at the encoder, e.g. by allocating each segment that is being encoded a certain proportion of a desired total buffer size. Each segment may then be allocated the same output buffer size. However, it is also contemplated that the output buffer sizes may also be allocated based on the image content. For instance, if it is known that certain areas of the image are less detailed, and e.g. show less variation in colour, e.g. so that the finer details that would be encoded using the higher frequencies are less significant, these areas may accordingly be assigned lower output buffer sizes than other areas including more fine details and variations in colour. An example of this would be when processing an image containing large areas of generally similar data elements, e.g. representing the sky, or grass, where there is little variation in the image, and which can thus be encoded relatively cheaply.

Although in the example shown in FIGS. 5 & 6 the stripes are written to one of a plurality of output buffers 602 it will be appreciated that in a variation of this "striped" encoding scheme the stripes may be written to respective pre-allocated portions of a single output buffer. In this case, it may generally be necessary to provide some form of rate control, or other mechanism, in order to ensure that the compressed data fills the allocated portion exactly. For instance, data structure padding and/or throttling may be performed substantially as described above.

Figure 7:
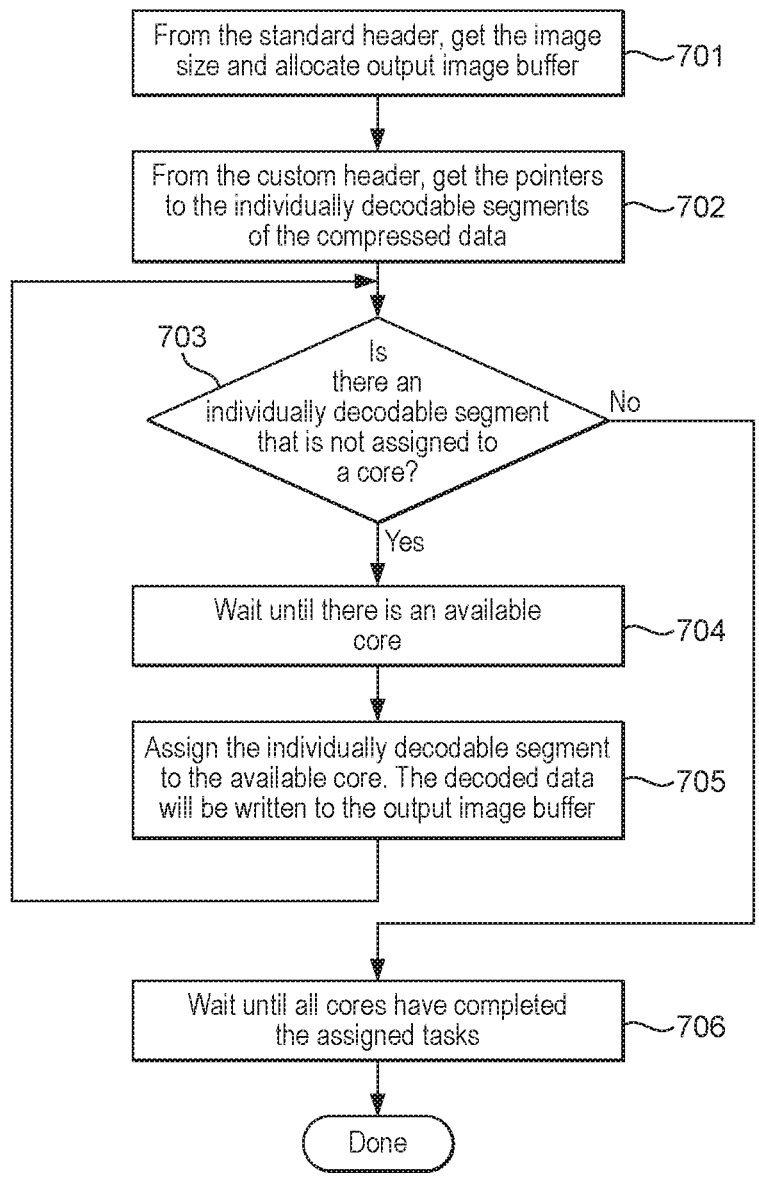
FIG. 7 is a flowchart illustrating an example of a decoding process that may be used according to embodiments of the technology described herein.
Figure 8:
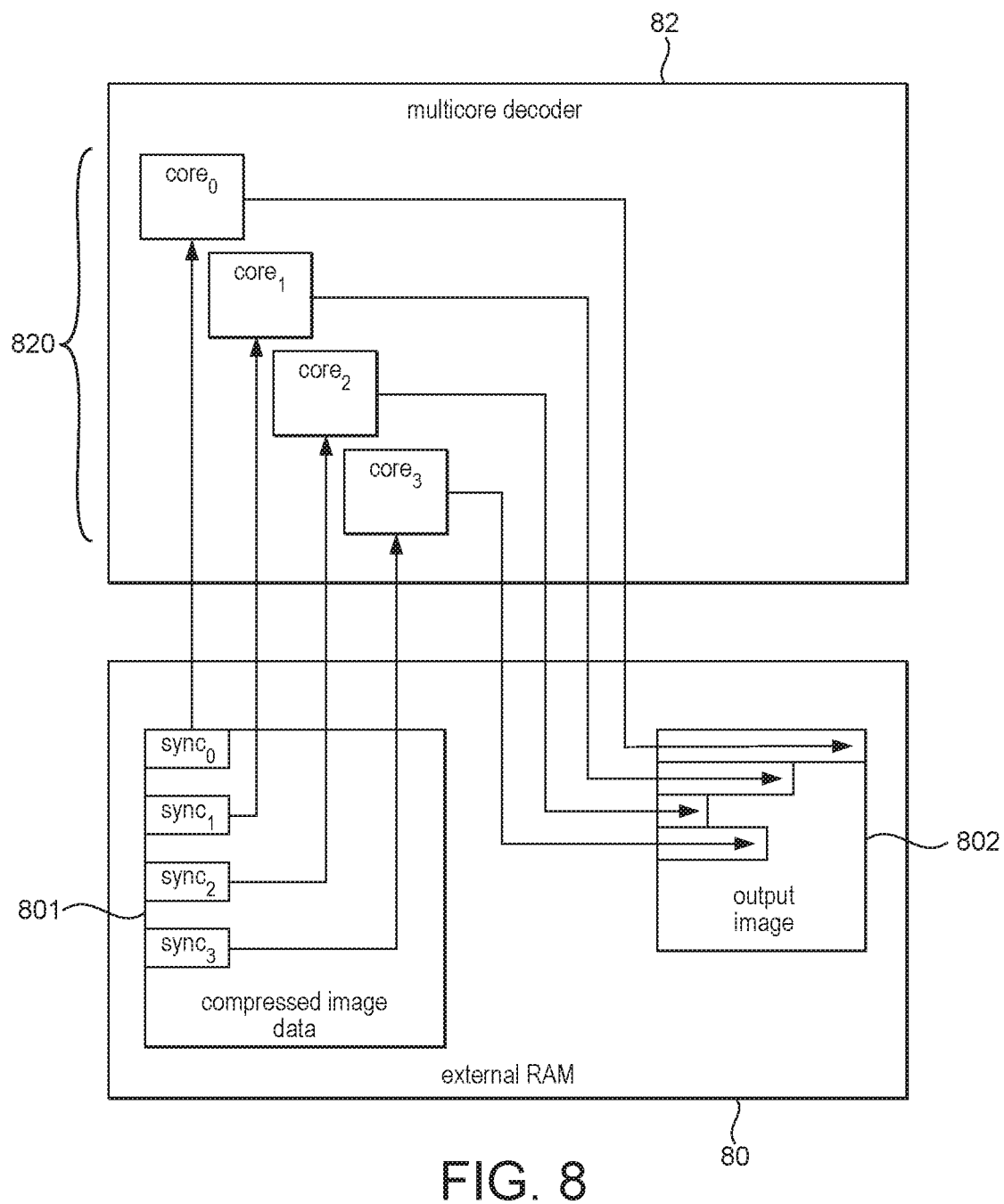
FIG. 8 shows schematically the operation of a multi-core decoding process of the type illustrated in FIG. 7.

FIGS. 7 & 8 illustrate a decoding process according to embodiments of the technology described herein. For instance, as shown in FIG. 8, in order to encode compressed image data 801 (e.g. of the type shown in FIG. 1), the compressed image data 801 may be passed from external RAM 80 to a multi-core decoder 82 including a plurality of decoding (processing) cores 820. Each of the independent segments identified from the header can be passed to a different core for encoding, with the cores then writing out the decoded image to an output 802 e.g. for display. Thus, the decoding scheme set forth in FIG. 7 may start in the conventional manner by first obtaining the image size from the standard header and allocating an output image buffer (step 701). The pointers to the individually decodable segments of the compressed image data 801 are then obtained from the custom header (step 702). It is then determined whether there is an individually decodable segment that has not been assigned to a core (step 703). Where there is an individually decodable segment that is not yet assigned to a core, the process waits until a core is available (step 704), and then assigns the individually decodable segment to the available core. The segment is then processed by the core and the decoded data is written out to the output image buffer 802 (step 705). The decoding process is complete when there are no more segments to be assigned to cores and when all of the cores 820 have completed their assigned tasks (step 706).

Of course, if the decoder is not able to read the custom header, the decoder can still proceed to decode the compressed image data 801, e.g. using conventional techniques. In such cases, the decoder can simply ignore the custom header.

Figure 9:
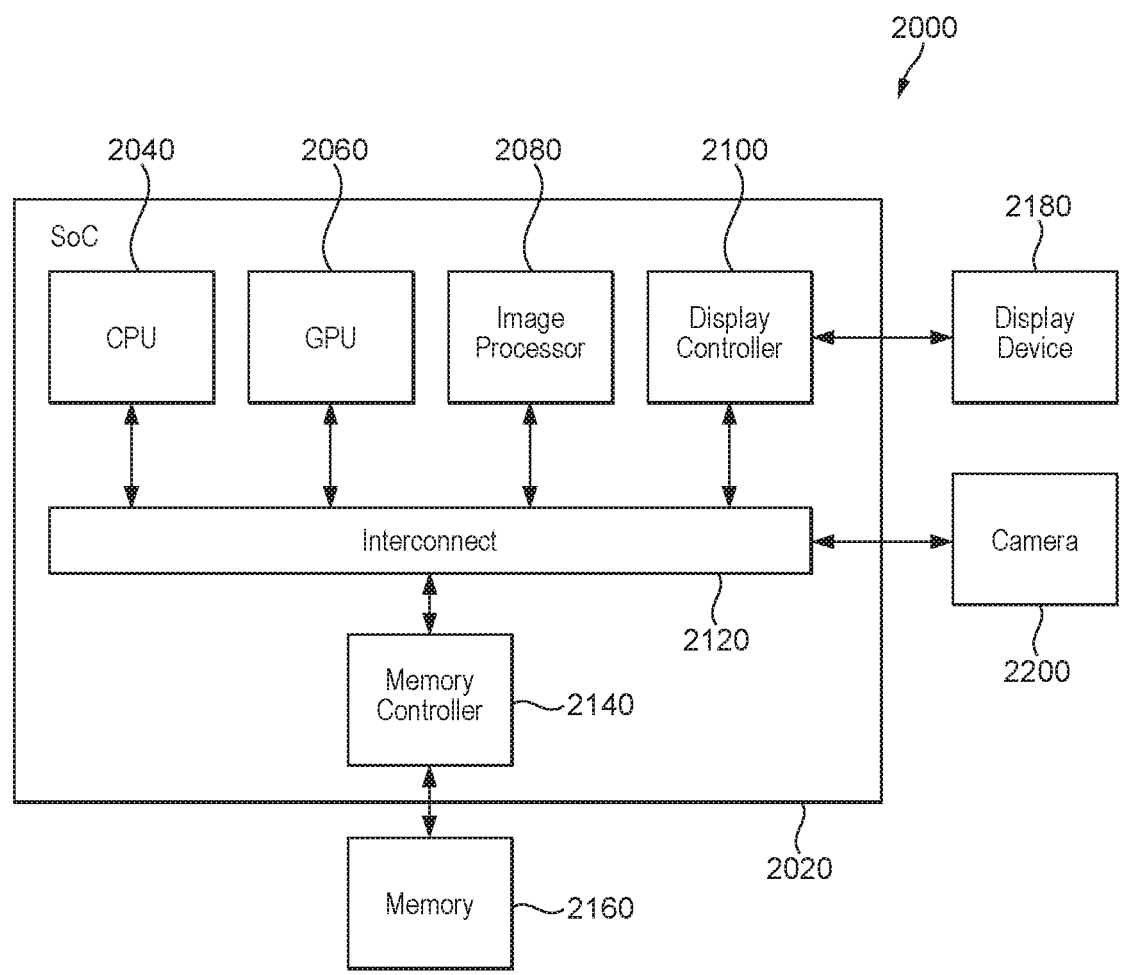
FIG. 9 shows schematically an example of a data processing system within which embodiments of the technology described herein may be implemented.

FIG. 9 shows schematically an embodiment of a data processing system 200 that can provide and use data arrays, such as images or video frames for display, that have been encoded in the manner of the present embodiments. It will be appreciated that FIG. 9 merely shows one example of a system that is suitable for use with the technology described herein, and that various other arrangements are possible.

In this embodiment, the system 2000 comprises a data processing apparatus in the form of a system on chip (SoC) 2020. The system 2000 also comprises off-chip (main) memory 2160, a display device 2180 and a video camera 2200.

The SoC 2020 comprises a central processing unit (CPU) 2040, a graphics processing unit (GPU) 2060, an image/video processor 2080, a display controller 2100, an interconnect 2120 and a memory controller 2140.

As is shown in FIG. 9, the CPU 2040, GPU 2060, image/video processor 2080, and display controller 2100 communicate with each other via the interconnect 2120 and with the memory 2160 via the interconnect 2120 and memory controller 2140. The display controller 2100 also communicates with the display device 2180. The video camera 2200 also communicates with the SoC 2020 via the interconnect 2120.

In embodiments, the image/video processor 2080 reads in image data from memory 2160, encodes the image data (e.g. in the manner described above), and then outputs that encoded image data, e.g. for storage in memory 2160 or for streaming to another device. The encoded image data can later be retrieved and decoded, e.g. by the image/video processor 2080, or received and decoded by another device. The decoded image data can then be output, e.g. by the display controller 2100 to the display device 2180 or by another device, for display.

The foregoing detailed description has been presented for the purposes of illustration and description. It is not intended to be exhaustive or to limit the technology described herein to the precise form disclosed. Many modifications and variations are possible in the light of the above teaching. The described embodiments were chosen in order to best explain the principles of the technology described herein and its practical applications, to thereby enable others skilled in the art to best utilise the technology described herein, in various embodiments and with various modifications as are suited to the particular use contemplated. It is intended that the scope be defined by the claims appended hereto.

What is claimed is:

1. An apparatus for encoding an array of data elements, or a stream of such arrays, the apparatus comprising an encoder comprising:
   an encoding circuit operable to, when encoding an array of data elements, or a stream of such arrays, encode the array(s) of data elements as a plurality of independent segments, wherein each independent segment can be decoded independently;
   an output circuit operable to output an encoded data stream including the plurality of independent segments; and
   a header generating circuit operable to generate a header for output with an encoded data stream, the header containing information indicative of the location of each of the plurality of independent segments within the encoded data stream,
   wherein the encoding circuit is configured to, when encoding a data array, or stream of data arrays:
   allocate an output buffer for the encoded data stream;
   pass a plurality of data element sets associated with an independent segment in parallel to a plurality of processing cores;
   pass the encoded data from each processing core to an internal buffer;
   when all of the encoded data for an independent segment is present in the internal buffer, stitch the encoded data for that independent segment together in order; and
   write out the stitched independent segment to the output buffer.

2. The apparatus of claim 1, wherein the encoded data stream comprises a plurality of markers defining the start of each of the independent segments; and wherein the header contains information indicative of the locations of the plurality of markers within the data stream.

3. The apparatus of claim 1, wherein the header comprises a plurality of pointers, each pointer pointing to a location of an independent segment within the data stream.

4. The apparatus of claim 1, wherein the encoding circuit is configured to align each of the independent segments to a data unit boundary in the encoded data stream.

5. The apparatus of claim 1, wherein the array of data elements represents an image, wherein the encoding is performed according to a JPEG encoding scheme.

6. An apparatus for encoding an array of data elements, or a stream of such arrays, the apparatus comprising an encoder comprising:
   an encoding circuit operable to, when encoding an array of data elements, or a stream of such arrays, encode the array(s) of data elements as a plurality of independent segments, wherein each independent segment can be decoded independently;
   an output circuit operable to output an encoded data stream including the plurality of independent segments; and
   a header generating circuit operable to generate a header for output with an encoded data stream, the header containing information indicative of the location of each of the plurality of independent segments within the encoded data stream,
   wherein the encoding circuit is configured to, when encoding a data array, or stream of data arrays:
   divide the data array(s) into a plurality of independent segments;
   allocate a respective output buffer, or portion of an output buffer, for each of the plurality of independent segments; and
   write the encoded data for each independent segment to the respective allocated output buffer or buffer portion to generate the data stream for output.

7. The apparatus of claim 6, wherein the encoding circuit is configured to encode the array(s) of data elements in parallel and/or wherein the encoder comprises a multi-core processor including a plurality of processing cores for encoding the array(s) of data elements in parallel.

8. The apparatus of claim 6, wherein the encoding circuit is configured to, when it is determined that there is a risk of the data for an independent segment overflowing its respective allocated output buffer or buffer portion, start to discard information during the encoding of the data for that independent segment.

9. The apparatus of claim 6, wherein the header comprises a plurality of pointers, each pointer pointing to a location of an independent segment within the data stream.

10. The apparatus of claim 6, wherein the encoding circuit is configured to align each of the independent segments to a data unit boundary in the encoded data stream.

11. A method for encoding an array of data elements, or a stream of such arrays, the method comprising a step of:
   encoding the array(s) as a plurality of independent segments, wherein each independent segment can be decoded independently, wherein the encoding comprises steps of:
allocating an output buffer for the encoded data stream;
passing a plurality of data elements associated with an independent segment in parallel to a plurality of processing cores;
passing the encoded data from each processing core to an internal buffer;
when all of the encoded data for an independent segment is present in the internal buffer, stitching the encoded data for that independent segment together in order; and
writing the stitched independent segment to the output buffer;
the method further comprising steps of:
outputting an encoded data stream including the plurality of independent segments;
generating a header for output with the data stream, the header containing information indicative of the location of each of the plurality of independent segments within the data stream; and
outputting the header with the encoded data stream.

12. The method of claim 11, comprising inserting into the encoded data stream a plurality of markers defining the start of each of the independent segments, wherein the header contains information indicative of the locations of the plurality of markers within the data stream.

13. The method of claim 11, wherein the header comprises a plurality of pointers, each pointer pointing to a location of an independent segment within the data stream.

14. The method of claim 11, comprising a step of aligning each of the independent segments to a data unit boundary in the encoded data stream.

15. A method for encoding an array of data elements, or a stream of such arrays, the method comprising a step of:
encoding the array(s) as a plurality of independent segments, wherein each independent segment can be decoded independently,
wherein the encoding comprises steps of:
dividing the data array(s) into a plurality of independent segments;
allocating a respective output buffer, or portion of an output buffer, for each of the plurality of independent segments; and
writing the encoded data for each independent segment to the respective allocated output buffer or buffer portion to generate the data stream for output,
the method further comprising steps of:
outputting an encoded data stream including the plurality of independent segments;
generating a header for output with the data stream, the header containing information indicative of the location of each of the plurality of independent segments within the data stream; and
outputting the header with the encoded data stream.

16. The method of claim 15, comprising encoding the array(s) in parallel.

17. The method of claim 15, further comprising determining whether there is a risk of the data for an independent segment overflowing its respective allocated output buffer or buffer portion and, when it is determined that there is a risk of the data for an independent segment overflowing its respective allocated output buffer or buffer portion, starting to discard information during the encoding of the data for that independent segment.

18. The method of claim 15, wherein the header comprises a plurality of pointers, each pointer pointing to a location of an independent segment within the data stream.

19. The method of claim 15, comprising a step of aligning each of the independent segments to a data unit boundary in the encoded data stream.

20. A non-transitory computer readable storage medium storing software code that when executed on a data processor performs a method of encoding an array of data elements, or a stream of such arrays, the method comprising steps of:
encoding the array(s) as a plurality of independent segments, wherein each independent segment can be decoded independently;
outputting an encoded data stream including the plurality of independent segments;
generating a header for output with the data stream, the header containing information indicative of the location of each of the plurality of independent segments within the data stream; and
outputting the header with the encoded data stream,
(i) wherein the encoding comprises steps of:
allocating an output buffer for the encoded data stream;
passing a plurality of data elements associated with an independent segment in parallel to a plurality of processing cores;
passing the encoded data from each processing core to an internal buffer;
when all of the encoded data for an independent segment is present in the internal buffer, stitching the encoded data for that independent segment together in order; and
writing the stitched independent segment to the output buffer; or
(ii) wherein the encoding comprises steps of:
dividing the data array(s) into a plurality of independent segments;
allocating a respective output buffer, or portion of an output buffer, for each of the plurality of independent segments; and
writing the encoded data for each independent segment to the respective allocated output buffer or buffer portion to generate the data stream for output.

* * * * *